US007239567B2

(12) United States Patent
Kwon

(10) Patent No.: US 7,239,567 B2
(45) Date of Patent: Jul. 3, 2007

(54) LIGHT EMITTING DISPLAY AND DATA DRIVER THERE OF

(75) Inventor: Oh-Kyong Kwon, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 114 days.

(21) Appl. No.: 11/228,755

(22) Filed: Sep. 15, 2005

(65) Prior Publication Data

US 2006/0077738 A1 Apr. 13, 2006

(30) Foreign Application Priority Data

Oct. 8, 2004 (KR) ...................... 10-2004-0080371
Oct. 8, 2004 (KR) ...................... 10-2004-0080373
Oct. 8, 2004 (KR) ...................... 10-2004-0080374

(51) Int. Cl.
*G11C 7/00* (2006.01)

(52) U.S. Cl. ......................... 365/203; 365/222; 345/82

(58) Field of Classification Search ........... 365/230.06, 365/203, 222, 215; 345/82, 98, 545, 547
See application file for complete search history.

(56) References Cited

U.S. PATENT DOCUMENTS 7,012,849 B2 * 3/2006 Otose ......................... 365/222
7,167,406 B2 * 1/2007 Komiya ...................... 365/203
7,180,493 B2 * 2/2007 Shin et al. .................... 345/92
2005/0285824 A1 * 12/2005 Shin ............................ 345/76
2006/0077139 A1 * 4/2006 Kwon ......................... 345/76

* cited by examiner

*Primary Examiner*—Richard T. Elms
*Assistant Examiner*—Hien N Nguyen
(74) *Attorney, Agent, or Firm*—Christie, Parker & Hale, LLP

(57) ABSTRACT

An organic light emitting diode display being driven according to a current programming method. A digital/analog converter of a data driver sequentially converts data signals representing gray scales to data currents and sequentially transmits the data currents to an output stage. The output stage sequentially samples the data currents and concurrently transmits the data currents to data lines. A precharge voltage is applied to a wire between the digital/analog converter and the output stage before a respective one of the data currents is transmitted to the output stage. As such, the data currents may be properly transmitted to the output stage.

35 Claims, 11 Drawing Sheets

LIGHT EMITTING DISPLAY AND DATA DRIVER THERE OF

CROSS-REFERENCES TO RELATED APPLICATIONS

This application claims priority to and the benefit of Korean Patent Application Nos. 10-2004-0080371, 10-2004-0080373, and 10-2004-0080374 filed in the Korean Intellectual Property Office on Oct. 8, 2004, the entire contents of which are incorporated herein by reference.

FIELD OF THE INVENTION

The present invention relates to a light emitting display, and more particularly, to a data driver for outputting data currents in the light emitting display.

BACKGROUND OF THE INVENTION

A light emitting display is a display device which uses a plurality of light emitting elements to display an image. Each of the light emitting elements emits light according to an applied current. Particularly, an organic light emitting diode display uses an organic light emitting cell as the light emitting element, and the organic light emitting cell has characteristics of a diode and can be referred to as an organic light emitting diode (OLED). The organic light emitting cell includes an anode, an organic thin film, and a cathode.

According to an addressing method, methods for driving the organic light emitting cells may be classified into a passive matrix method or an active matrix method. In the passive matrix method, the organic light emitting cells are formed between anode lines and cathode lines perpendicularly crossing the anode line, and driven by selecting the respective lines. In the active matrix method, a thin film transistor is coupled to each pixel electrode (e.g., an anode line), and the organic light emitting cells are driven according to a voltage maintained by a capacitor coupled to a gate of a thin film transistor. Further, depending on formats of signals applied to the capacitor for maintaining the voltage, the active matrix method may be categorized as either a voltage programming method or a current programming method.

A pixel circuit according to the voltage programming method has difficulties in obtaining high gray scales because of deviations in threshold voltages and/or in electron mobilities of thin film transistors, the deviations being caused by non-uniformity of a manufacturing process. On the other hand, according to the current programming method, uniform display characteristics are achieved even though driving transistors in each pixel have non-uniform voltage-current characteristics, provided that a current source for supplying the current to the pixel is uniform throughout the whole panel (i.e., all the data lines).

However, in the light emitting display using the current programming method, it is necessary to provide a data driver which converts a data signal representing a gray scale to an analog current (hereinafter, "data current") to be applied to a data line coupled to the pixel circuit.

The data driver needs a digital/analog converter for converting the digital data signal to the analog data current and an output stage for buffering and outputting the converted data current. Generally, before the data currents are transmitted to the data lines during one horizontal period, the output stage has to buffer the data currents corresponding to the pixel circuits on one row during the horizontal period. However, as the resolution of a light emitting display becomes higher, a horizontal period becomes shorter. Because of this, the output stage may not be able to buffer the data currents during the horizontal period when a magnitude of a data current is small. As a result, the data currents can be improperly transmitted to the data lines.

SUMMARY OF THE INVENTION

An embodiment of the present invention provides a data driver for converting data signals representing gray scales to data currents and for outputting the data currents to data lines. The embodiment of the present invention also provides a data driver for properly transmitting the data current to an output stage.

According to an embodiment of the present invention, a wire coupled to an output stage is precharged before a data current is transmitted to the output stage.

One embodiment of the invention provides a data driver for sequentially receiving a plurality of data signals representing gray scales and applying a plurality of data currents to a plurality of data lines formed on a display area of a light emitting display. The data driver includes at least one converter, at least one output stage, at least one wire, and a precharge unit. The converter converts the data signals to the data currents, and the output stage sequentially receives the data currents transmitted from the converter and transmits the received data currents to the data lines. The wire is coupled between the converter and the output stage, and the precharge unit applies a precharge voltage to the wire before a respective one of the data currents is transmitted to the output stage.

According to an exemplary embodiment of the present invention, the converter includes a first transistor having a drain to which the respective one of the data currents flows. The precharge unit includes a second transistor coupled to the first transistor as a current mirror, and outputs a voltage corresponding to a drain voltage of the second transistor determined by the respective one of the data currents as the precharge voltage. Herein, the precharge unit may further include a unit gain amplifier coupled between the drain of the second transistor and a first terminal of the wire.

According to another exemplary embodiment of the present invention, the precharge voltage is predetermined and is independent of the data currents.

According to still another exemplary embodiment of the present invention, the converter includes a first transistor having a drain coupled to a first terminal of the wire and a source coupled to a first power source for supplying a first voltage. The output stage includes a second transistor having a drain coupled to a second terminal of the wire and a source coupled to a second power source for supplying a second voltage. The precharge unit outputs a third voltage between the second voltage and the first voltage as the precharge voltage.

According to another exemplary embodiment of the present invention, the precharge unit determines a voltage corresponding to a respective one of the data signals to be the precharge voltage.

According to yet another exemplary embodiment of the present invention, the precharge unit includes a voltage converter for generating the precharge voltage from at least one data bit among a plurality of data bits of the respective one of the data signals.

One embodiment of the invention provides a light emitting display including a display area, a scan driver, and a data driver. The display area includes a plurality of data lines, a plurality of first scan lines, a plurality of second scan lines, and a plurality of pixel areas. The first and second scan lines are extending perpendicular to the data lines, and each of the pixel areas is defined by a respective one of the data lines and a respective one of the first scan lines and has at least one light emitting element. The scan driver selectively transmits a plurality of select signals to the plurality of first scan lines, and selectively transmits a plurality of emission control signals to the plurality of second scan lines. The data driver includes a converter for sequentially receiving a plurality of data signals and for sequentially converting the plurality of data signals to a plurality of data currents, and an output stage for sequentially receiving the data currents from the converter and for transmitting the data currents to the plurality of data lines. A precharge voltage is applied to a wire coupled between the converter and the output stage before a respective one of the data currents is transmitted from the converter to the output stage.

DETAILED DESCRIPTION

Figure 1:
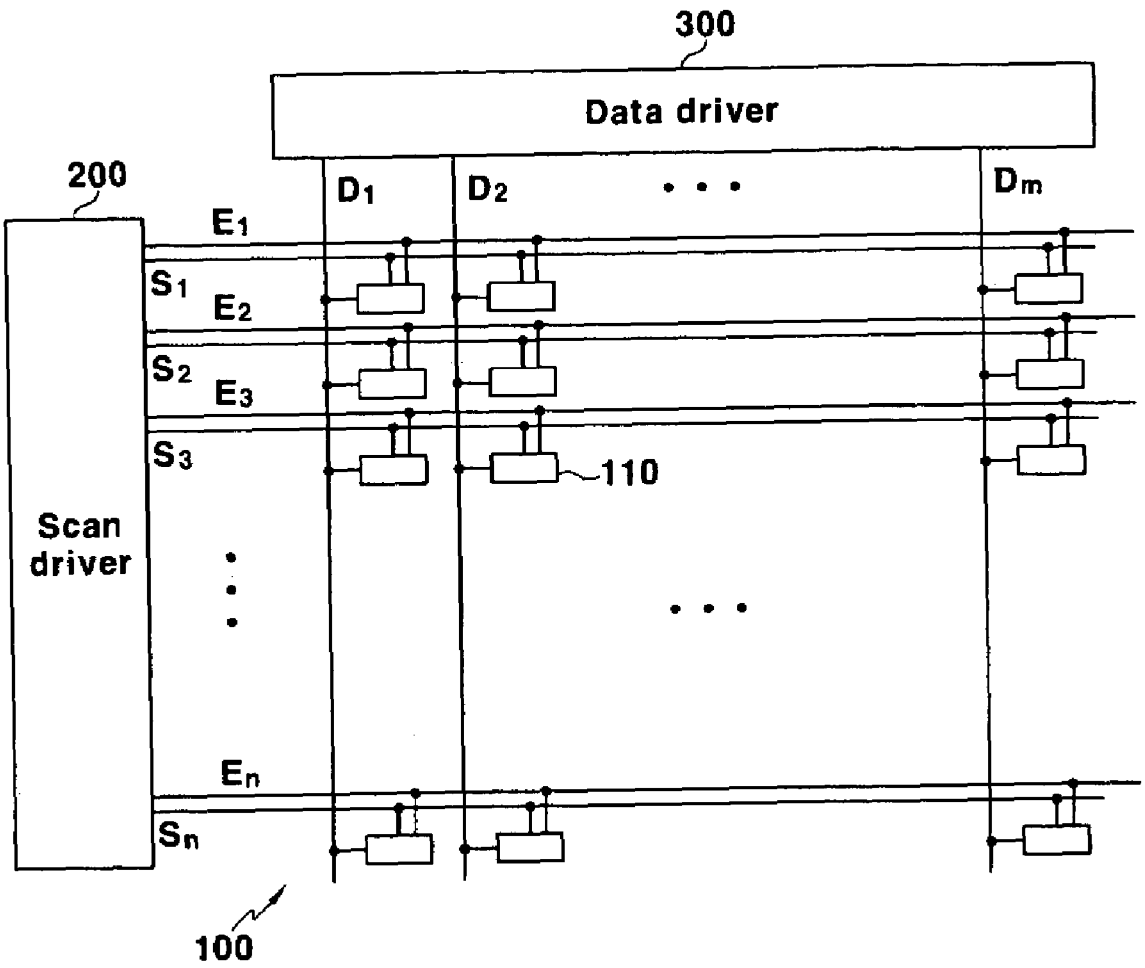
FIG. 1 shows a plan view of a light emitting display according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

FIG. 1 shows a plan view of a light emitting display according to an exemplary embodiment of the present invention.

As shown in FIG. 1, the light emitting display includes a display area 100 seen as a screen to a user, a scan driver 200, and a data driver 300.

The display area 100 includes a plurality of data lines $D_1$ to $D_m$, a plurality of select scan lines $S_1$ to $S_n$, a plurality of emit scan lines $E_1$ to $E_n$, and a plurality of sub-pixels 110. The data lines $D_1$ to $D_m$ are extended in a column direction and transmit data currents representing images to the corresponding sub-pixels 110. The select scan lines $S_1$ to $S_n$ are extended in a row direction and transmit select signals for selecting corresponding data lines $D_1$ to $D_m$ crossing to the select scan lines $S_1$ to $S_n$ to apply the data currents to the sub-pixels 110 of the corresponding data and scan lines $D_1$ to $D_m$ and $S_1$ to $S_n$. The emit scan lines $E_1$ to $E_m$ are extended in a row direction and transmit emission control signals for controlling light emission of the sub-pixels 110.

A pixel area is defined by one of the data lines $D_1$ to $D_m$ and one of the select scan lines $S_1$ to $S_n$, and a sub-pixel 110 is formed on the pixel area. For example, the sub-pixel 110 coupled to the $i^{th}$ select scan line and the $j^{th}$ data line programs the data current from the data line $D_j$ in response to the select signal from the select scan line $S_i$, and represents a gray scale corresponding to the programmed data current in response to the emission control signal from the emit scan line $E_i$. Also, it is assumed that a pixel is formed by the sub-pixel for emitting light of the red (R) color, the sub-pixel for emitting light of the green (G) color, and the sub-pixel for emitting light of the blue (B) color.

The data driver 300 sequentially receives the data signals representing gray scales from a timing controller (not shown), converts the received data signals to the data currents, and applies the converted data currents to the data lines $D_1$ to $D_m$ corresponding to the sub-pixels 110 of the data and scan lines $D_1$ to $D_m$ and $S_1$ to $S_n$ to which select signals are applied. The scan driver 200 sequentially applies the select signals to the select scan lines $S_1$ to $S_n$, and sequentially applies the emission control signals to the emit scan lines $E_1$ to $E_m$.

In one embodiment, the scan driver 200 and/or the data driver 300 are fabricated as integrated circuits (ICs) and the ICs are mounted on a substrate on which the display area 100 is formed. Alternatively, in one embodiment, the ICs are mounted on flexible connecting members, such as tape carrier packages (TCPs), flexible printed circuits (FPCs), and the flexible connecting members that are attached to the substrate to be coupled thereto. On the other hand, the scan driver 200 and/or the data driver 300 may be substituted with driving circuits formed in the substrate, which are made of the same layers as the scan lines, the data lines, and the transistors for driving the sub-pixels. In addition, the scan driver 200 and/or the data driver 300 may be mounted on printed circuit boards which are electrically coupled to the substrate on which the display area 100 is formed.

The data driver 300 of FIG. 1 will be described in more detail with reference to FIG. 2 and FIG. 3.

Figure 2:
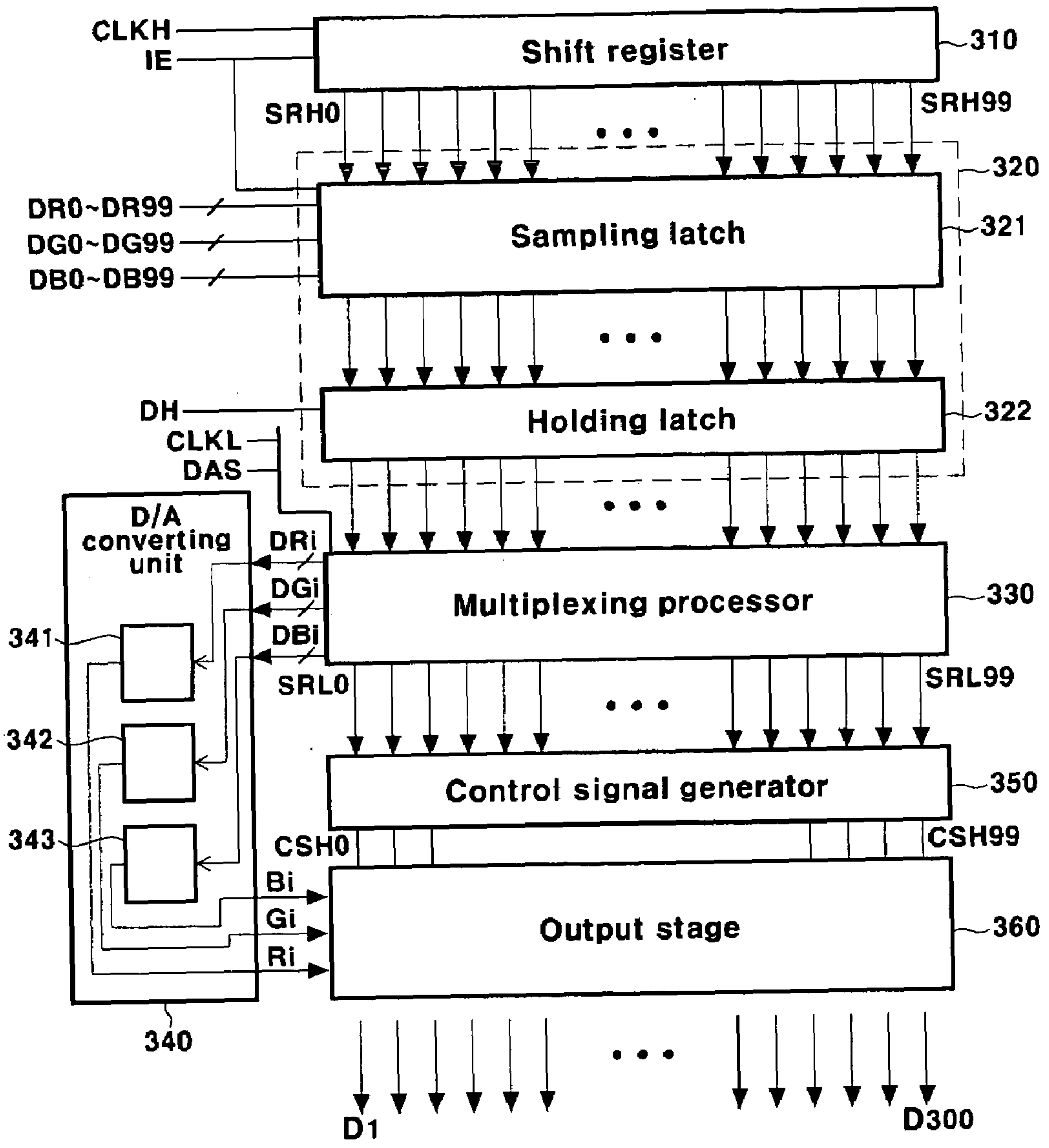
FIG. 2 shows a diagram of a configuration of a data driver according to a first exemplary embodiment of the present invention.
Figure 3:
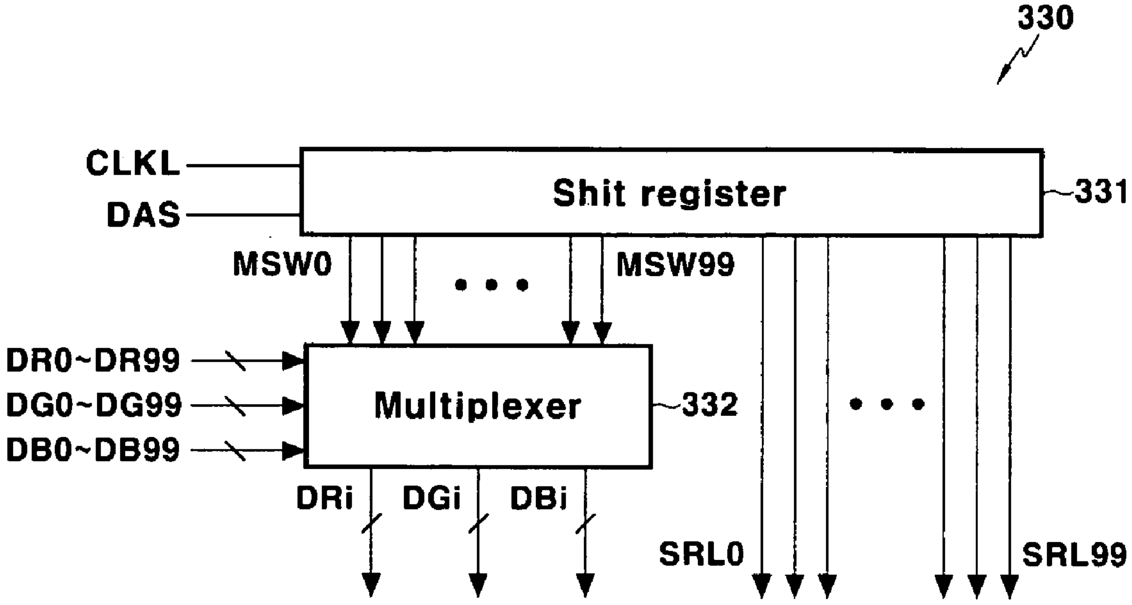
FIG. 3 shows a diagram of a configuration of a multiplexing processor of the data driver shown in FIG. 2.

FIG. 2 shows a diagram of a configuration of the data driver 300 according to a first exemplary embodiment of the present invention, and FIG. 3 shows a diagram of a configuration of a multiplexing processor 330 of the data driver 300 shown in FIG. 2. For exemplary purposes, 300 data lines $D_1$ to $D_{300}$ corresponding to 100 pixels, i.e., 100 data lines corresponding to R sub-pixels, 100 data lines corresponding to G sub-pixels, and 100 data lines corresponding to B sub-pixels, are shown in FIG. 2 and FIG. 3. That is, the data driver 300 with 300 channels is exemplarily described, but the present invention is not thereby limited. Also, it is assumed that the data signals corresponding to the 100 pixels of one row are sequentially input to the data driver 300, and the R, G, and B data signals corresponding to the 3 sub-pixels of the pixel are input to the data driver 300 in parallel.

As shown in FIG. 2, the data driver 300 includes a shift register 310, a latch 320, a multiplexing processor 330, a digital to analog (hereinafter, D/A) converting unit 340, a control signal generator 350, and an output stage 360. In FIG. 2, the latch 320, the multiplexing processor 330, the D/A converting unit 340, and the output stage 360 process the R, G, and B data signals or the R, G, and B data currents corresponding to one pixel in parallel.

The shift register 310 sequentially shifts a sampling signal to transmit a plurality of sampling signals SRH0 to SRH99 to the latch 320. The latch 320 sequentially samples and holds the R, G, and B data signals DR0 to DR99, DG0 to DG99, and DB0 to DB99 according to the sampling signals SRH0 to SRH99, and includes a sampling latch 321 and a hold latch 322.

In more detail, the shift register 310 generates the sampling signal SRH0 in response to an enable signal IE, and sequentially shifts the sampling signals SRH0 in synchronization with a clock CLKH to sequentially output the plurality of sampling signals SRH0 to SRH99. As such, the 100 sampling signals SRH0 to SRH99 corresponding to the 100 pixels on the one row are generated.

The sampling latch 321 sequentially samples the R, G, and B data signals DR0 to DR99, DG0 to DG99, and DB0 to DB99 in response to the sampling signals SRH0 to SRH99, respectively. That is, the sampling latch 321 samples the R, G, and B data signals DRi, DGi, and DBi corresponding to the $(i+1)^{th}$ pixel in response to the sampling signal SRHi (where, 'i' is an integer between 0 and 99). In one embodiment, if the R, G, and B data signals DRi, DGi, and DBi are respectively 10 bits data, the sampling latch 321 samples 30 bits data for each pixel. The hold latch 322 holds the data signals which are sequentially sampled by the sampling latch 321 until the data signals corresponding to the one row are sampled, and outputs the sampled data signals DR0 to DR99, DG0 to DG99, and DB0 to DB99 in response to a holding enable signal DH.

As shown in FIG. 3, the multiplexing processor 330 includes a shift register 331 and a multiplexer 332. The shift register 331 sequentially outputs multiplexing signals MSW0 to MSW99 and shift signals SRL0 to SRL99 by receiving a clock CLKL and an enable signal DAS. At this time, a frequency of the clock CLKL applied to the shift register 331 may be less than the same of the clock CLKH applied to the shift register 310, and the enable signal DAS has a same timing as the enable signal DH applied to the holding latch 322. The multiplexing signals MSW0 to MSW99 and the shift signals SRL0 to SRL99 are output from the timing controller (not shown) in synchronization with the clock CLKL. In addition, the multiplexing signals MSW0 to MSW99 are transmitted to the multiplexer 332 of the multiplexing processor 330, and the shift signals SRL0 to SRL99 are transmitted to the control signal generator 350.

The multiplexer 332 of the multiplexing processor 330 multiplexes each of the R, G, and B data signals DR0 to DR99, DG0 to DG99, and DB0 to DB99 output from the holding latch 322 in response to each of the multiplexing signals MSW0 to MSW99, and sequentially transmits the R, G, and B data signals DR0 to DR99, DG0 to DG99, and DB0 to DB99 to the D/A converting unit 340. That is, the multiplexer 332 transmits the R, G, and B data signals DRi, DGi, and DBi to the D/A converting unit 340 in response to the multiplexing signal MSWi.

The D/A converting unit 340 sequentially converts the R, G, and B data signals DR0 to DR99, DG0 to DG99, and DB0 to DB99 to the data currents R0 to R99, G0 to G99, and B0 to B99, and sequentially outputs the converted data currents R0 to R99, G0 to G99, and B0 to B99 to the output stage 360. Herein, the D/A converting unit 340 includes R, G, and B D/A converters 341, 342, and 343, and the R, G, and B D/A converters 341, 342, and 343 respectively convert the R, G, and B data signals to the R, G, and B data currents.

The control signal generator 350 sequentially receives the shift signals SRL0 to SRL99 from the multiplexing processor 330, and generates sampling signals CHS0 to CHS99 to sequentially output them to the output stage 360. The sampling signal CHSi is generated by the shift signal SRLi to be synchronized with a time when the R, G, and B data currents Ri, Gi, and Bi converted by the D/A converting unit 340 in response to the multiplexing signal MSWi are transmitted to the output stage 360.

The output stage 360 sequentially samples the R, G, and B data currents R0 to R99, G0 to G99, and B0 to B99 in response to each of the sampling signals CHS0 to CHS99. That is, the output stage 360 samples the R, G, and B data currents Ri, Gi, and Bi, which are input from the D/A converting unit 340 in response to the sampling signal CSH1. The output stage 360 samples the R, G, and B data currents R0 to R99, G0 to G99, and B0 to B99 corresponding to the pixels of one row and concurrently outputs the sampled R, G, and B data currents R0 to R99, G0 to G99, and B0 to B99 to the corresponding data lines $D_1$ to $D_{300}$.

In the above, a process has been described in which the R, G, and B data signals corresponding to the pixels of one row are input to the data driver 300 to be converted to the data currents, and the data currents are output to the data lines of the display area 100. The data driver 300 repeatedly performs this process to the R, G, and B data signals corresponding to the pixels of all rows, thereby converting the data signals corresponding to one frame to the data currents and outputting the converted data currents to the data lines of the display area 100. In addition, according to the first exemplary embodiment, the D/A converters are not formed according to the data lines $D_1$ to $D_m$ but formed according to the colors of the R, G, and B data Therefore, the number of the D/A converters can be reduced.

Figure 4:
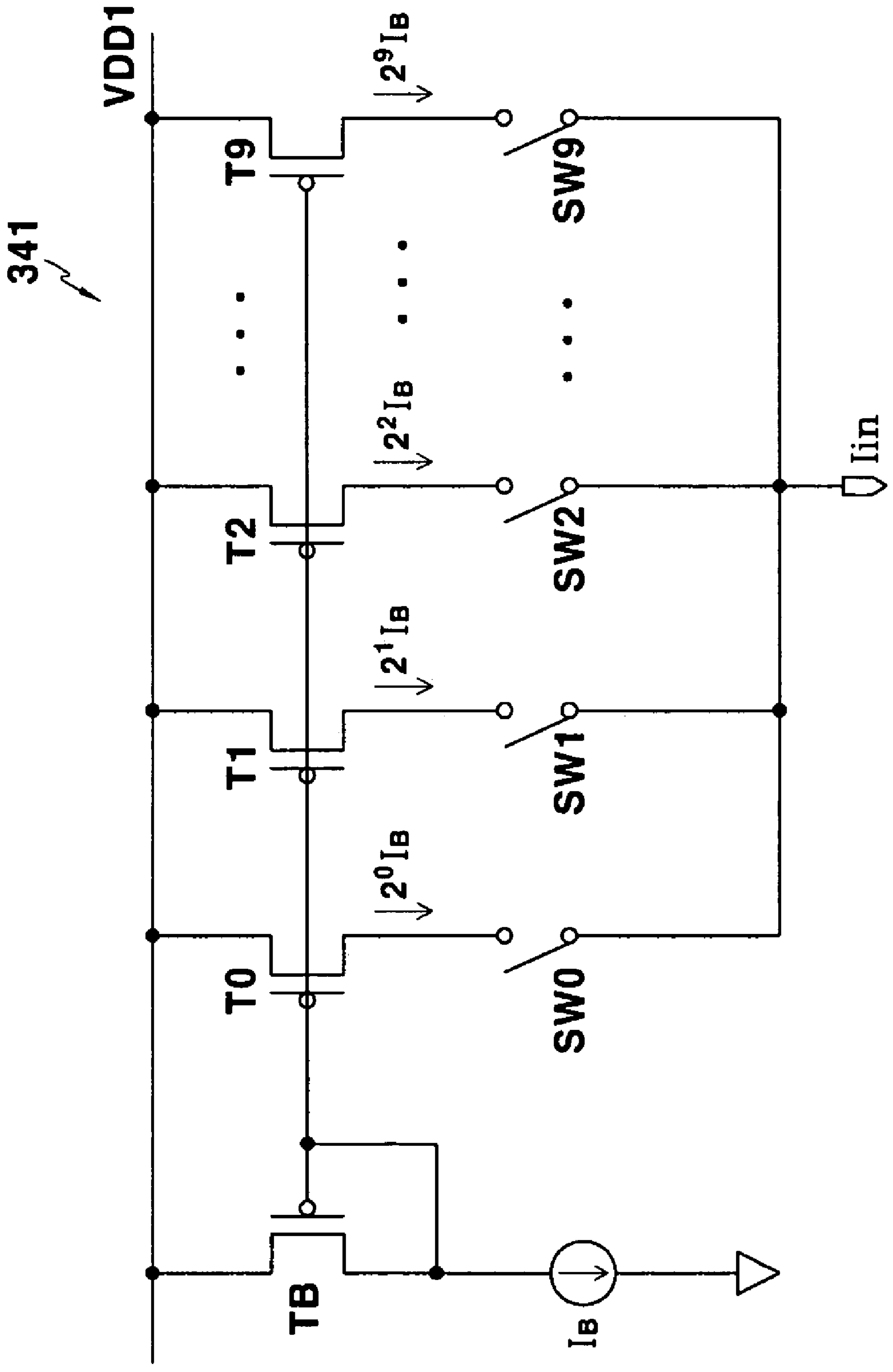
FIG. 4 shows a diagram of a configuration of an example of a digital to analog (D/A) converter.

Next, an example of the D/A converting unit 340 used in the data driver 300 will be described with reference to FIG. 4. FIG. 4 shows a diagram of a configuration of an example of the D/A converter 341. In FIG. 4, the R D/A converter 341 of the D/A converting unit 340 is shown, and the G and B D/A converters 342 and 343 having substantially the same structure as the R D/A converter 341 will not be shown and/or described in more detail.

Figure 5:
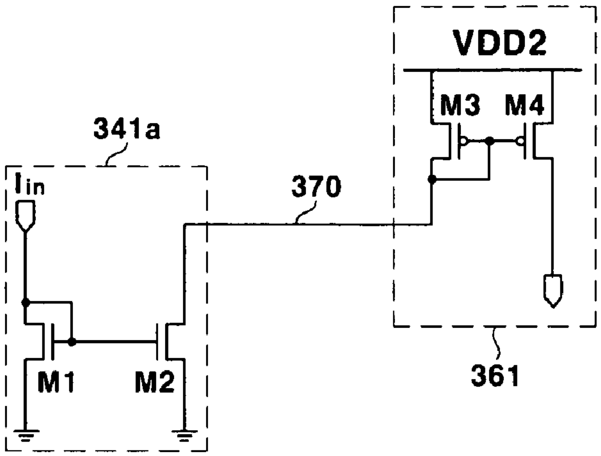
FIG. 5 shows an output terminal of the D/A converter and an input terminal of an output stage in the data driver according to the first exemplary embodiment of the present invention.

Referring to FIG. 4, the D/A converter 341 includes a transistor TB coupled to a current source $I_B$, 10 mirror transistors T0 to T9, switches SW0 to SW9, and an output terminal 341*a* (shown in FIG. 5). The transistors T0 to T9 are respectively coupled to the transistor TB as current mirrors, and sizes of the mirror transistors T0 to T9 are respectively $2^0$ to $2^9$ times a size of the transistor TB. Herein, the size of the transistor is a ratio W/L of a channel width W and a channel length L of the transistor. In more detail, the transistor TB is diode-connected, and has a source coupled to a power voltage VDD1 and a drain coupled to the current source $I_B$. The transistor Tj has a source coupled to the power voltage VDD1 and a gate coupled to a gate of the transistor TB (where 'j' is an integer from 0 to 9). A switch SWj is coupled between a drain of the transistor Tj and the output terminal 341*a* (FIG. 5) of the D/A converter 341.

Then, currents $2^0I_B$ to $2^9I_B$, which are respectively $2^0$ to $2^9$ times the current $I_B$ flowing through the drain of the transistor TB, respectively output through the drains of the mirror transistors T0 to T9. Each of the switches SW0 to SW9 is turned on in response to a one bit data of the 10 bits R data signal DRi which are sequentially transmitted from the multiplexer 332 of the multiplexing processor 330. For example, when the R data signal DRi is "0101000101", the switches SW0, SW2, SW6, and SW8 corresponding to bit data of '1' are turned on so that a data current $I_{in}$ transmitted to the output terminal 341*a* (FIG. 5) of the D/A converter 341 is $(2^0+2^2+2^6+2^8)I_B$.

As described above, the D/A converters respectively convert the R, G, and B data signals to the R, G, and B data currents and respectively transmit the R, G, and B data currents to the output stage 360 through wires 370 (shown in FIG. 5).

FIG. 5 shows the output terminal 341*a* of the D/A converter 341 and an input terminal 361 of the output stage 360 in the data driver 300 according to the first exemplary embodiment of the present invention. In FIG. 5, only the output terminal 341*a* of the R D/A converter 341 and the input terminal 361 of the output stage 360 coupled to the R D/A converter 341 are shown, and the output terminals of the G and B D/A converters 342 and 343 have substantially the same structure as that 341*a* of the R D/A converter 341. In addition, the output stage 360 has input terminals which are coupled to the G and B D/A converters 342 and 343 and have substantially the same structure as that 361 coupled to R D/A converter 341.

As shown in FIG. 5, the output terminal 341*a* of the D/A converter 341 includes a current mirror M1 and M2, and the input terminal 361 of the output stage 360 also includes a current mirror M3 and M4. In FIG. 5, transistors M1 and M2 forming the current mirror of the D/A converter 341 are depicted as NMOS transistors, and transistors M3 and M4 forming the current mirror of the output stage 360 are depicted as PMOS transistors In the output terminal 341*a*, the data current $I_{in}$ from the D/A converter 341 is transmitted to a drain of the diode-connected transistor M1, and a source of the transistor M1 is coupled to a ground voltage. The transistor M2 has a source coupled to the ground voltage and a gate coupled to a gate of the transistor M1, and a drain of the transistor M2 is coupled to the input terminal 361 of the output stage 360 through the wire 370.

In the input terminal 361, a drain of the diode-connected transistor M3 is coupled to the output terminal 341*a* of the D/A converter 341 through the wire 370, and a source of the transistor M3 is coupled to a power voltage VDD2. The transistor M4 has a source coupled to the power voltage VDD2 and a gate coupled to a gate of the transistor M3. A current flowing to a drain of the transistor M4 is an input current of the output stage 360.

The two transistors M1 and M2 have the-same size, and the two transistors M3 and M4 have the same size. Because of this, a current having the same magnitude as the data current $I_{in}$ flowing to the drain of the transistor M1 flows from the drain of the transistor M3 to the drain of the transistor M2 through the wire 370. Therefore, a current having the same magnitude as the data current $I_{in}$ of the D/A converter 341 flows to the drain of the transistor M4 of the output stage 360.

In a like manner, when the R, G, and B data currents corresponding to the pixels on one row are sequentially output from the D/A converting unit 340, the output stage sequentially samples these R, G, and B data currents. Herein, a period during which the R, G, and B data currents corresponding to the pixels on one row are transmitted to the output stage 360 is substantially equal to one horizontal period. That is, a period during which the R, G, and B data currents corresponding to the one pixel transmitted to the output stage 360 (hereinafter, "a data transmitting period") is a period corresponding to 1/100 of the one horizontal period. However, when the magnitude of the data current is small and parasitic components on the wire 370 are great, the data currents may not be properly transmitted to the output stage 360 during the data transmitting period so that the output stage 360 does not sample the required currents.

Figure 6:
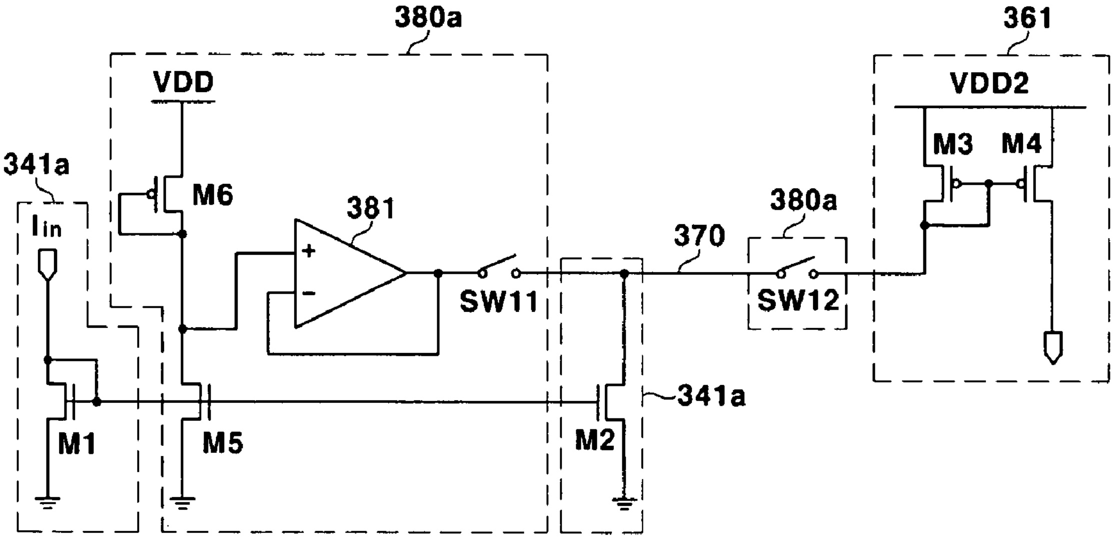
FIG. 6, FIG. 8, and FIG. 10 show output terminals of D/A converters, precharge units, and input terminals of output stages in data drivers according to second, third, and fourth exemplary embodiments of the present invention, respectively.

FIG. 6 shows the output terminal 341*a* of the D/A converter 341, a precharge unit 380*a*, and the input terminal 361 of the output stage 360 in the data driver according to a second exemplary embodiment of the present invention.

As shown in FIG. 6, the data driver according to the second exemplary embodiment further includes the precharge units 380*a* which are respectively coupled between the output terminals of the R, G, and B D/A converters 341, 342, and 343 and the input terminals (e.g. the input terminal 361) of the output stage 360 in contrast with the first exemplary embodiment. Only the precharge unit 380*a* coupled to the output terminal 341*a* of the R D/A converter 341 and the input terminal 361 of the output stage 360 are shown in FIG. 6, and the precharge units having substantially the same structure as the precharge unit 380*a* respectively are coupled to the G and B D/A converters 342 and 343.

The precharge unit 380*a* includes transistors M5 and M6, switches SW11 and SW12, and a unit gain amplifier 381. In FIG. 6, the transistor M5 is depicted as an NMOS transistor, and the transistor M6 is depicted as a PMOS transistor.

The transistor M5 has a gate coupled to the gate of the transistor M1 and a source coupled to the ground voltage, and forms a current mirror together with the transistor M1. The transistor M6 is diode-connected, and has a drain coupled to the drain of the transistor M5 and a source coupled to the power voltage VDD2. The transistors M5 and M6 respectively have the same sizes and characteristics as the transistors M2 and M3. The drains of the transistors M5 and M6 are coupled to an input terminal of the unit gain amplifier 381, and the switch SW11 is coupled between an output terminal of the unit gain amplifier 381 and a first terminal of the wire 370. The switch SW12 is coupled between the input terminal 361 of the output stage 361 and a second terminal of the wire 370. Herein, an output voltage of the unit gain amplifier 381 is applied to the wire 370 as a precharge voltage.

Figure 7:
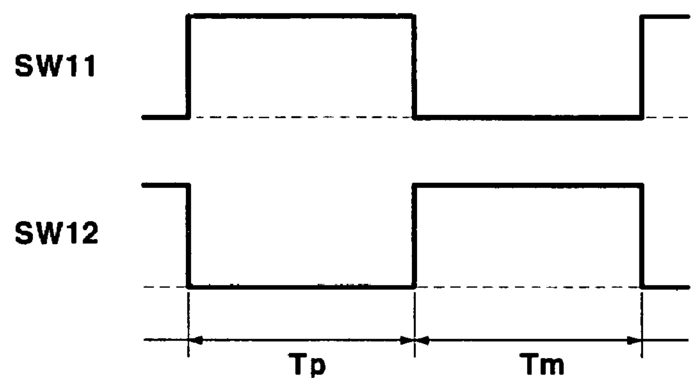
FIG. 7, FIG. 9, and FIG. 11 show switching timing diagrams of the precharge units of FIG. 6, FIG. 8, and FIG. 10, respectively.

Next, an operation of the precharge unit 380*a* will be described also with reference to FIG. 7. FIG. 7 shows a switching timing diagram of the precharge unit 380*a* of FIG. 6. In FIG. 7, the data transmitting period corresponding to the one pixel is shown, and a high level and a low level respectively represent a turn-on state and a turn-off state of each of the switches SW11 and SW12.

Referring FIG. 7, the data transmitting period includes a precharge period Tp and a mirroring period Tm.

In the precharge period Tp, the switch SW11 is turned on, and the switch SW12 is turned off. Then, a current having the same magnitude as the data current $I_{in}$ transmitted to the drain of the transistor M1 flows to the drain of the transistor M5, and a voltage at the drain of the transistor M5 is determined by the drain current of the transistor M5. That is, the power voltage VDD2 is divided by on-resistances of the transistors M5 and M6 to be the voltage at the drain of the transistor M5. Then, the unit gain amplifier 381 applies the precharge voltage having substantially the same level as the voltage at the drain of the transistor M5 to the first terminal of wire 370 and the drain of the transistor M2. Accordingly, a voltage at the wire 370 and the drain voltage of the transistor M2 are substantially equal to the voltage at the drain of the transistor since the switch SW12 is turned off.

In the mirroring period Tm, the switch SW11 is turned off, and the switch SW12 is turned on. Since the voltage at the wire 370 has been set to be substantially equal to the drain voltage of the transistor M2 in the precharge period Tp, the drain voltage of the transistor M3 is substantially equal to the drain voltage of the transistor M2 when the switch SW12 is turned on. In this embodiment, since the sizes and characteristics of the transistors M2 and M3 are respectively the same as those of the transistors M5 and M6, and the voltage at the drains of the transistors M2 and M3 are equal to the voltage at the drains of the transistors M5 and M6. Accordingly, a current flowing to the drains of the transistors M2 and M3 is substantially equal to the data current $I_{in}$ flowing to the drains of the transistors M5 and M6 in the beginning of the mirroring period Tm. That is, the data current $I_{in}$ can be transmitted from the drain of the transistor M1 to the drain of the transistor M3 in the beginning of the mirroring period Tm.

As described above, according to the second exemplary embodiment, the data current $I_{in}$ can be transmitted from the output terminal 341*a* of the D/A converter 341 to the input terminal 361 of the output stage 360 even if the data transmitting period is short.

Figure 8:
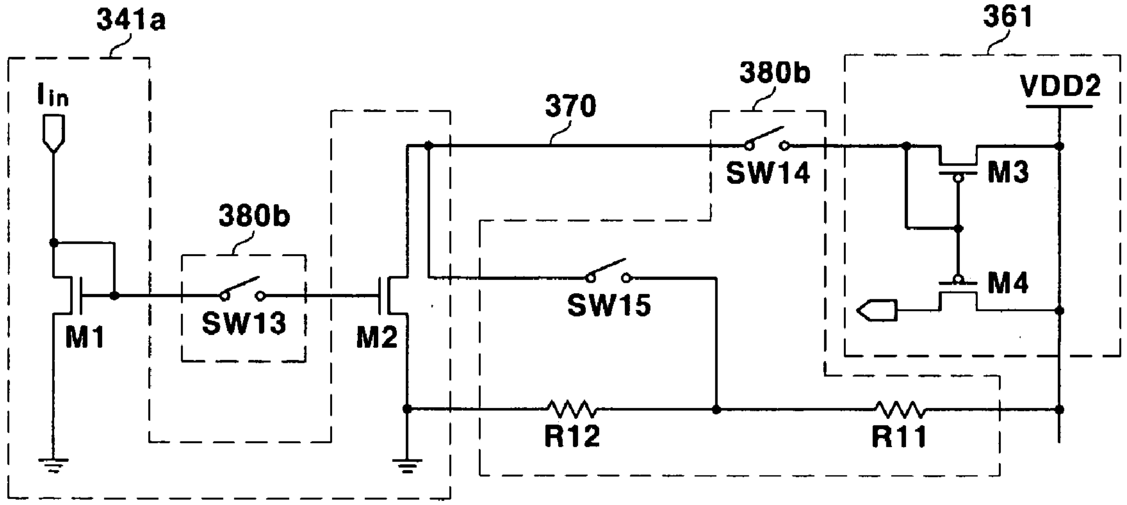
Figure 9:
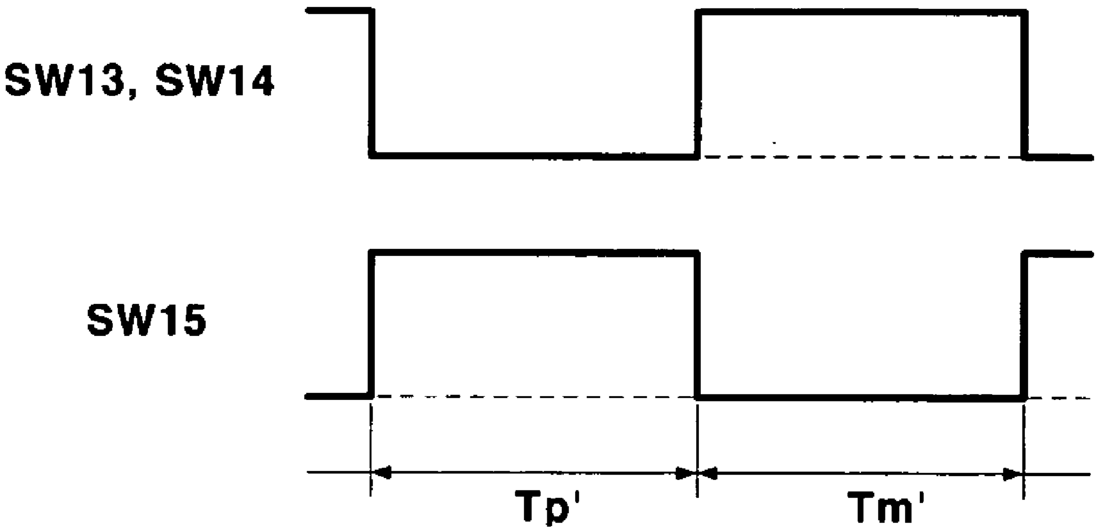

FIG. 8 shows the output terminal 341*a* of the D/A converter 341, a precharge unit 380*b*, and the input terminal 361 of the output stage 360 in the data driver according to a third exemplary embodiment of the present invention, and FIG. 9 shows a switching timing diagram of the precharge unit 380*b* of FIG. 8. In FIG. 9, a high level and a low level respectively represent a turn-on state and a turn-off state of each of the switches SW13, SW14, and SW15.

As shown in FIG. 8, the data driver according to the third exemplary embodiment has substantially the same structure as the second exemplary embodiment except for the precharge unit 380*b*.

In more detail, the precharge unit 380*b* includes resistors R11 and R12, and switches SW13, SW14, and SW15. The resistors R11 and R12 are coupled in series between the power voltage VDD2 and the ground voltage, and the resistors R11 and R12 have substantially the same resistance magnitudes. The switch SW13 is coupled between the gate of the transistor M1 and the gate of the transistor M2, and the switch SW14 is coupled between the second terminal of the wire 370 and the drain of the transistor M3. The switch SW15 is coupled between a point where the resistors R11 and R12 meet and the first terminal of the wire 370.

Referring to FIG. 9, in a precharge period Tp', the switches SW13 and SW14 are turned off, and the switch SW15 is turned on. Then, the power voltage VDD2 and the ground voltage are divided by the resistors R11 and R12 so that a voltage VDD2/2 corresponding to a half of the power voltage VDD2 is applied to the first terminal of the wire 370 as the precharge voltage.

Next, in a mirroring period Tm', the switch SW15 is turned off and the switches SW13 and SW14 are turned on. Then, the drain voltages of the transistors M2 and M3 are determined by the data current $I_{in}$ between the power voltage VDD2 and the ground voltage. In the meantime, since the drains of the transistors M2 and M3 coupled to the wire 370 have been precharged to the VDD2/2 voltage in the precharge period Tp', the drain voltages of the transistors M2 and M3 can be quickly changed to voltages corresponding to the data current $I_{in}$. Therefore, in one embodiment of the present invention, a period during which the data current $I_{in}$ is transmitted to the drain of the transistor M3 is shortened.

While the wire 370 has been described to be precharged to VDD2/2 voltage by the resistors R11 and R12 having the same resistance magnitudes in the third exemplary embodiment, the resistors R11 and R12 may have different resistance magnitudes so that the wire 370 is precharged to another voltage.

Figure 10:
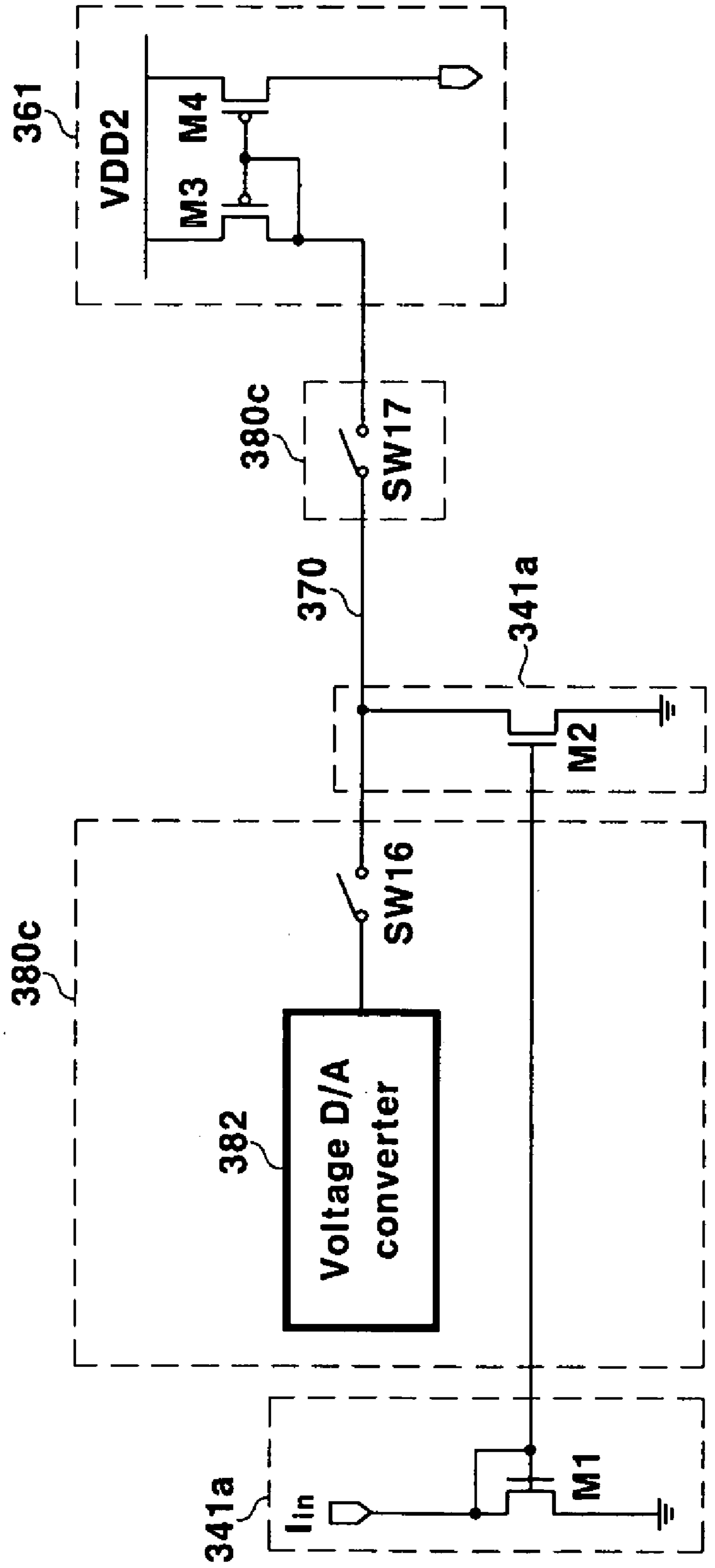
Figure 11:
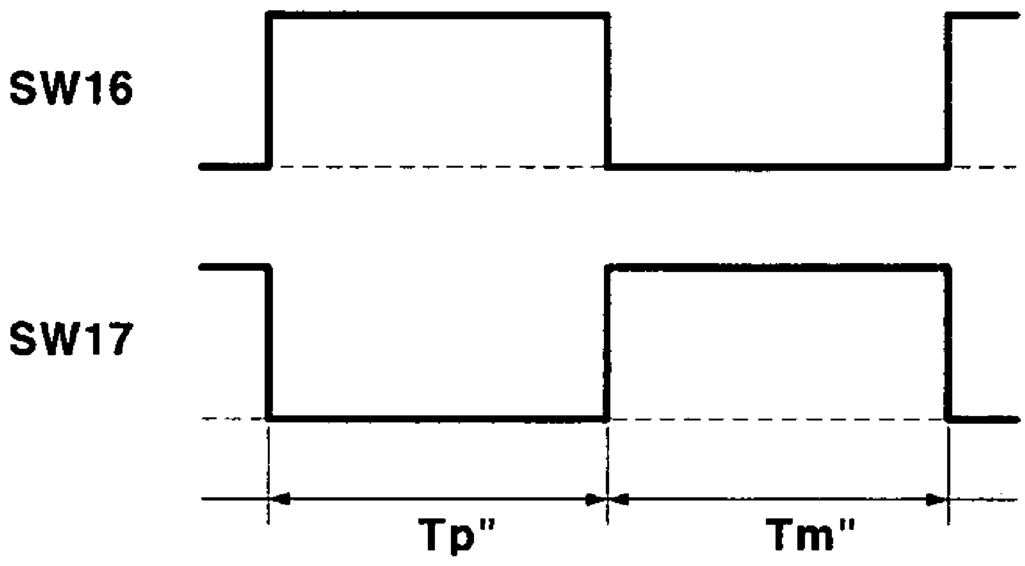

FIG. 10 shows the output terminal 341*a* of the D/A converter 341, a precharge unit 380*c*, and the input terminal 361 of the output stage 360 in the data driver according to a fourth exemplary embodiment of the present invention, and FIG. 11 shows a switching timing diagram of the precharge unit 380*c* of FIG. 10. In FIG. 11, a high level and a low level respectively represent a turn-on state and a turn-off state of each of the switches SW16 and SW17.

As shown in FIG. 10, the data driver according to the fourth exemplary embodiment has substantially the same structure as that of the second exemplary embodiment, except for the precharge unit 380*c*.

In more detail, the precharge unit 380*c* includes a voltage D/A converter 382, and switches SW16 and SW17. The voltage D/A converter 382 receives the R data signal DRi transmitted to the D/A converter 341 and converts the received R data signal DRi to a voltage. The switch SW16 is coupled between an output terminal of the voltage D/A converter 382 and the first terminal of the wire 370, and the switch SW17 is coupled to the second terminal of the wire 370 and the input terminal 361 of the output stage 360. A voltage of the wire 370 can be calculated when the data current $I_{in}$ flows to the input terminal 361. That is, the drain voltage of the transistor M3 when the data current flows to the drains of the transistors M2 and M3 corresponds to the voltage of the wire 370. Accordingly, the precharge unit 380*c* receives the data signal DRi transmitted to the D/A converter 341, and converts the data signal DRi to a voltage equivalent to when the data current corresponding to the data signal DRi flows to the input terminal 361 of the output stage 360. In addition, the precharge unit 380*c* applies the converted voltage to the first terminal of the wire 370 as the precharge voltage.

Referring FIG. 11, in a precharge period Tp", the switch SW16 is turned on, and the switch SW17 is turned off. Then, the D/A converter 382 generates the precharge voltage according to the data signal DRi transmitted to the D/A converter 382 and applies the precharge voltage to the wire 370 through the switch SW16. That is, the wire 370 is charged to the precharge voltage.

Next, in a mirroring period Tm", the switch SW16 is turned off, and the switch SW17 is turned on. Since the wire 370 has been charged to the precharge voltage corresponding to the data signal DRi, the current flowing to the drain of the transistor M1 can be transmitted to the drain of the transistor M3 in the beginning of the mirroring period Tm".

As described above, the drain voltage of the transistor M3 when the data current $I_{in}$ corresponding to the data signal DRi flows to drains of the transistors M2 and M3 is used as the precharge voltage in the fourth exemplary embodiment.

Generally, the voltage D/A converter 382 uses a plurality of resistors coupled in series and a plurality of switches respectively coupled to the plurality of resistors to convert the data signal to the precharge voltage. When the data signal DRi is 10 bits data, the voltage D/A converter 382 needs a large number of the resistors and the switches for processing the $2^{10}$ data signals so that a dimension of the voltage D/A converter 382 increases. In order to reduce the dimension of the voltage D/A converter 382, the precharge voltage may be determined by high order bits of the 10 bits data.

Figure 12:
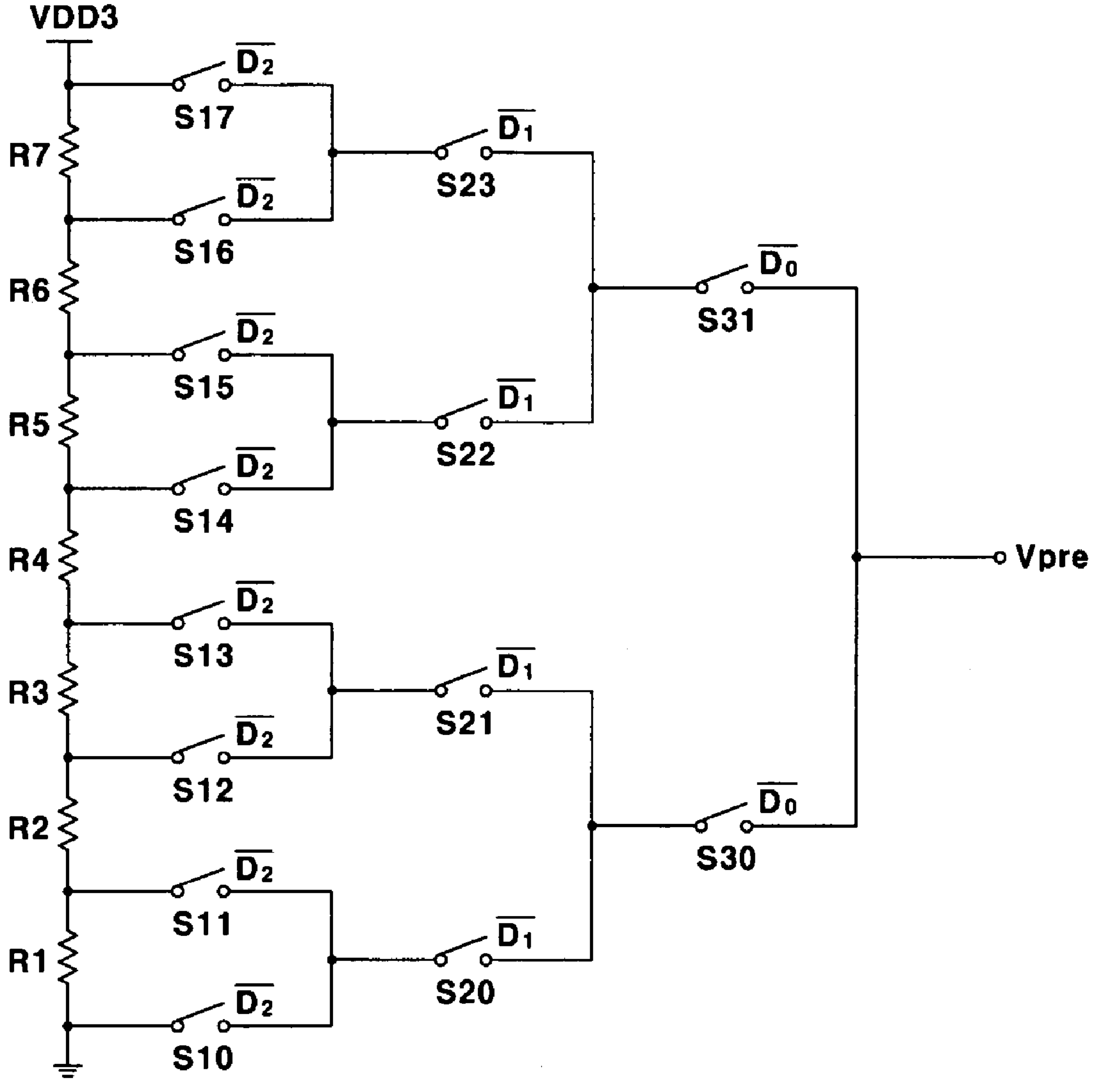
FIG. 12 shows an example of a voltage D/A converter shown in FIG. 10.

FIG. 12 shows an example of the voltage D/A converter 382 shown in FIG. 10. In FIG. 12, the voltage D/A converter 382 is shown to determine the precharge voltage by using 3 high order bits $D_0$, $D_1$, and $D_2$ of 10 bits data signal.

As shown in FIG. 12, the voltage D/A converter 382 includes a plurality of resistors R1 to R7, and a plurality of switches S10 to S17, S20 to S23, S30, and S31. The resistors R1 to R7 are coupled in series between a power voltage VDD3 and the ground voltage. The 8 switches S10 to S17 are respectively coupled to a point where the ground voltage and the resistor R1 meet, 6 points adjacent to where two of the resistors R1 to R7 meet, and a point where the power voltage VDD3 and the resistor R7 meet. The switch S20 is coupled to a point where the switches S10 and S11 meet, and the switch S21 is coupled to a point where the switches S12 and S13 meet. The switch S22 is coupled to a point where the switches S14 and S15 meet, and the switch S23 is coupled to a point where the switches S16 and S17 meet. In addition, the switch S30 is coupled to a point where the switches S20 and S21 meet, and the switch S31 is coupled to a point where the switches S22 and S23 meet. A voltage output from a point where the switches S30 and S31 meet is the precharge voltage Vpre.

Herein, the switch S30 is turned on when the most significant bit (MSB) $D_0$ is '1', and the switch S31 is turned on when the MSB $D_0$ is '0'. The switches S20 and S22 are turned on when the second higher order bit $D_1$ is '1', and the switches S21 and S23 are turned on when the second higher order bit $D_1$ is '0'. The switches S10, S12, S14, and S16 are turned on when the third higher order bit $D_2$ is '1', and the switches S11, S13, S15, and S17 are turned on when the third higher order bit $D_0$ is '0'. Then, the switches which will be turned on among the plurality of switches S10 to S17, S20 to S23, S30, and S31 are determined by the 3 high order bits $D_0$, $D_1$, and $D_2$ so that the precharge voltage Vpre is determined. For example, when the 3 high order bits $D_0$, $D_1$, and $D_2$ are '110', the switches S30, S20, and S11 are turned on so that the power voltage VDD3 is divided by the resistors R2 to R7 and the resistor R1 to output as the precharge voltage Vpre.

As described above, while the R, G, and B D/A converters are formed on D/A converting units 340 in the first to fourth exemplary embodiments, one D/A converter may be used to convert the R, G, and B gray scale data to the current. In this case, the multiplexing processor 330 sequentially transmits the R, G, and B data signals corresponding to the one pixel to the D/A converting unit 340.

In addition, while one D/A converting unit 340 is formed on the data driver 300 in the first to fourth exemplary embodiments, a plurality of D/A converting units may be formed in the data driver 300. That is, the plurality of data lines $D_1$ to $D_m$ may be divided into a plurality of groups, and the plurality of D/A converting units respectively corresponding to the plurality of groups may be formed.

Figure 13:
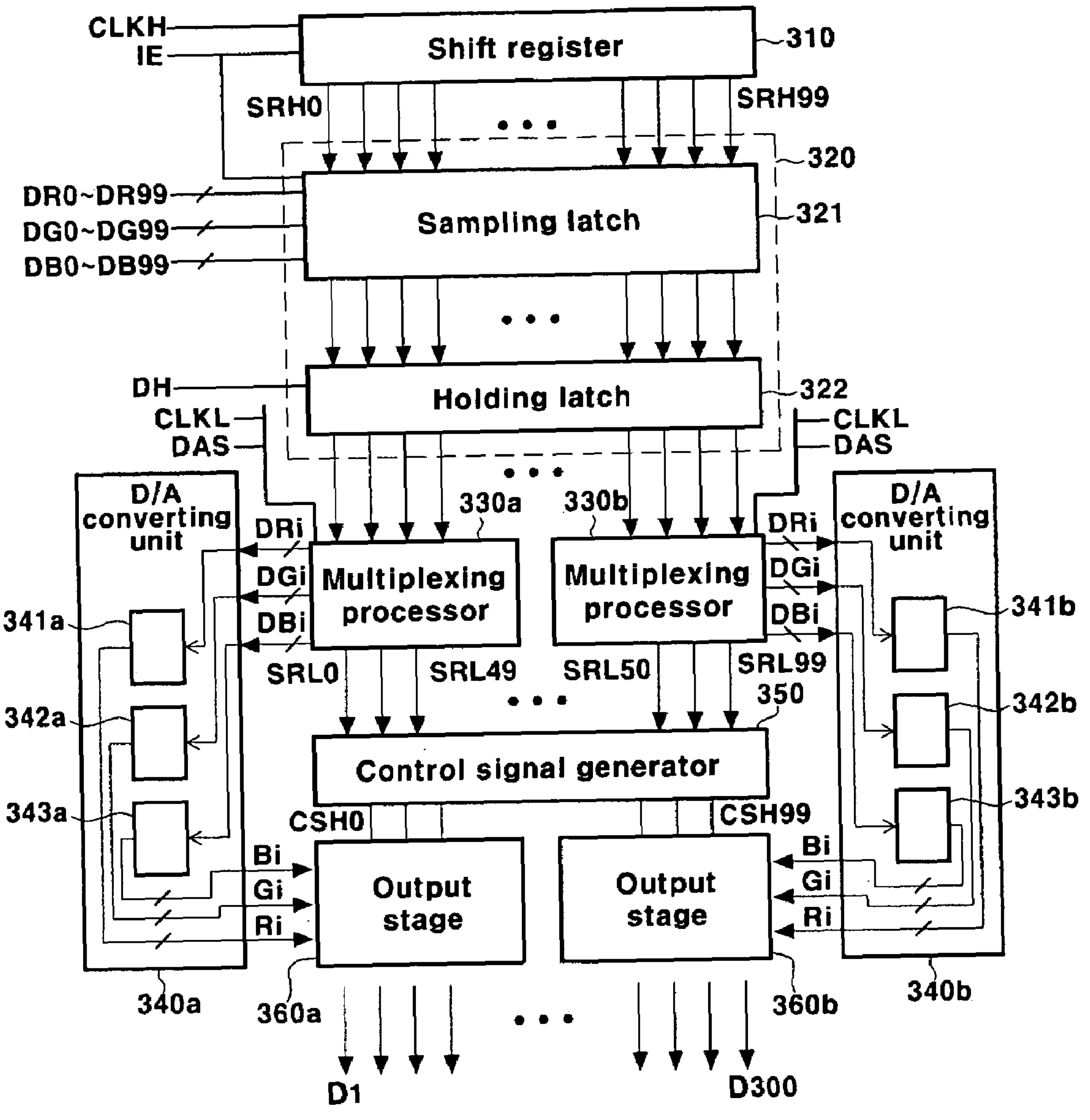
FIG. 13 shows a diagram of a configuration of a data driver according to a fifth exemplary embodiment of the present invention.
Figure 3:
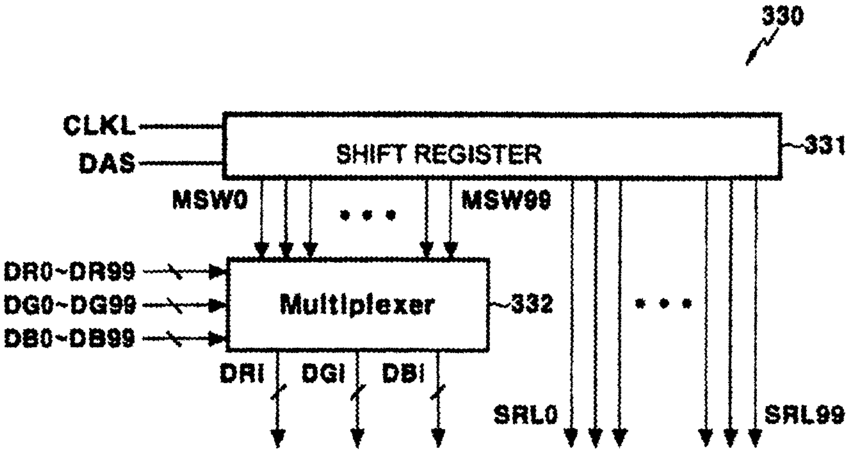
Figure 3:
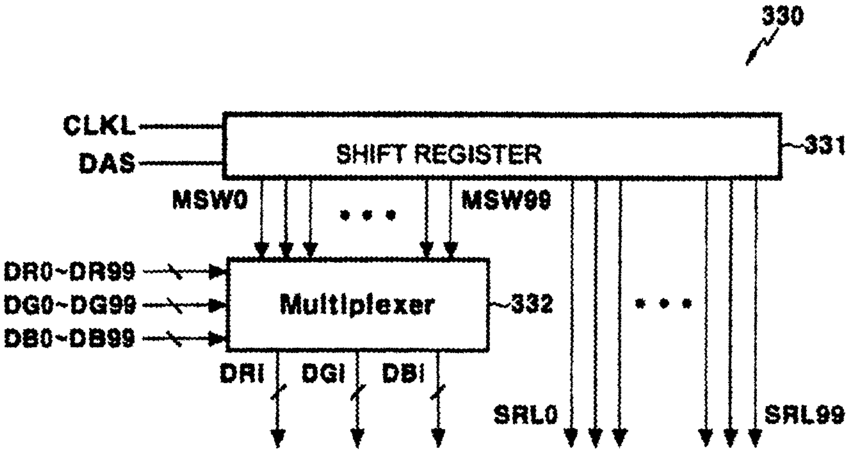

FIG. 13 shows a diagram of a configuration of a data driver according to a fifth exemplary embodiment of the present invention. In FIG. 13, a case in which 2 D/A converting units are formed on the data driver is shown.

As shown in FIG. 13, the data driver 300' according to the fifth exemplary embodiment has substantially the same structure as the first exemplary embodiment. However, the data driver 300' includes 2 D/A converting units 340*a* and 340*b*, 2 multiplexing processors 330*a* and 330*b*, and 2 output stages 360*a* and 360*b* in contrast with the data driver 300 shown in FIG. 2.

In more detail, a shift-register (not shown) of the multiplexing processor 330*a* sequentially outputs 50 multiplexing signals MSW0 to MSW49, and shifting signals SRL0 to SRL49. A multiplexer (not shown) of the multiplexing processor 330*a* multiplexes each of the $1^{st}$ to $50^{th}$ R, G, and B data signals DR0 to DR49, DG0 to DG49, and DB0 to DB49 output from the holding latch 322 in response to each of the multiplexing signals MSW0 to MSW49, and sequentially transmits the R, G, and B data signals DR0 to DR49, DG0 to DG49, and DB0 to DB49 to the D/A converting unit 340*a*. In like manner, a shift register (not shown) of the multiplexing processor 330*b* sequentially outputs 50 multiplexing signals MSW50 to MSW99, and shifting signals SRL50 to SRL99. A multiplexer (not shown) of the multiplexing processor 330*b* multiplexes each of the $51^{st}$ to $100^{th}$ R, G, and B data signals DR50 to DR99, DG50 to DG99, and DB50 to DB99 output from the holding latch 322 in response to each of the multiplexing signals MSW50 to MSW99, and sequentially transmits the R, G, and B data signals DR50 to DR99, DG50 to DG99, and DB50 to DB99 to the D/A converting unit 340*b*.

The D/A converting unit 340*a* sequentially converts the R, G, and B data DR0 to DR49, DG0 to DG49, and DB0 to DB49 to the data currents R0 to R49, G0 to G49, and B0 to B49, and sequentially outputs the converted data currents R0 to R49, G0 to G49, and B0 to B49 to the output stage 360*a*. In like manner, the D/A converting unit 340*b* sequentially converts the R, G, and B data DR50 to DR99, DG50 to DG99, and DB50 to DB99 to the data currents R50 to R99, G50 to G99, and B50 to B99, and sequentially outputs the converted data currents R50 to R99, G50 to G99, and B50 to B99 to the output stage 360*b*.

The control signal generator 350 sequentially receives the shift signals SRL0 to SRL49 and SRL50 to SRL99 from the multiplexing processors 330*a* and 330*b*, generates sampling signals CHS0 to CHS49 to sequentially output them to the output stage 360*a*, and generates sampling signals CHS50 to CHS99 to sequentially output them to the output stage 360*b*. The output stage 360*a* sequentially samples the R, G, and B data currents R0 to R49, G0 to G49, and B0 to B49 in response to each of the sampling signals CHS0 to CHS49, and the output stage 360*b* sequentially samples the R, G, and B data currents R50 to R99, G50 to G99, and B50 to B99 in response to each of the sampling signals CHS50 to CHS99.

According to the fifth exemplary embodiment, since the data signals corresponding to the two pixels are processed in parallel, the data transmitting period can be increased. As a result, the data current can be properly transmitted from the D/A converting units (e.g., the D/A converting units 340*a* and 340*b*) to the output stages (e.g., the output stages 360*a* and 360*b*). In addition, the precharge unit 380*a*, 380*b*, or 380*c* described in the second to fourth exemplary embodiments may be applicable to the fifth exemplary embodiment.

In the first to fifth exemplary embodiments, while the data driver for outputting the data current corresponding to the 300 data lines $D_1$ to $D_{300}$ is described, the data driver does not have to be limited to this number of data lines. In addition, the data driver may be manufactured as an integrated circuit (IC), and the plurality of ICs can be formed on the light emitting display. Furthermore, while one pixel is described to be formed by the R, G, and B sub-pixels, the one pixel may be formed by at least two sub-pixels, or the one pixel may be formed by one sub-pixel.

According to the exemplary embodiments of the present invention, the data signals may be converted to the data currents to be transmitted to the plurality of data lines, and the plurality of data lines may share one D/A converting unit so that a dimension of the D/A converting unit is minimized. In addition, the data currents output from the D/A converting unit may be properly transmitted to the output stage.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A data driver for sequentially receiving a plurality of data signals representing gray scales and applying a plurality of data currents to a plurality of data lines formed on a display area of a light emitting display, the data driver comprising:

at least one converter for converting the data signals to the data currents;

at least one output stage for sequentially receiving the data currents transmitted from the at least one converter and transmitting the received data currents to the data lines;

at least one wire coupled between the at least one converter and the at least one output stage; and a precharge unit for applying a precharge voltage to the wire before a respective one of the data currents is transmitted to the output stage.

2. The data driver of claim 1, wherein the converter comprises a first transistor having a drain to which the respective one of the data currents flows, and wherein the precharge unit comprises a second transistor coupled to the first transistor as a current mirror, and outputs a voltage corresponding to a drain voltage of the second transistor determined by the respective one of the data currents as the precharge voltage.

3. The data driver of claim 2, wherein the precharge unit further comprises a unit gain amplifier coupled between the drain of the second transistor and a first terminal of the wire.

4. The data driver of claim 3, wherein the precharge unit further comprises a first switch coupled between an output terminal of the unit gain amplifier and the first terminal of the wire; and a second switch coupled between a second terminal of the wire and the output stage, and wherein the first switch is turned on and the second switch is turned off so that the precharge voltage is applied to the wire, and wherein the first switch is turned off and the second switch is turned on so that the respective one of the data currents is transmitted to the output stage.

5. The data driver of claim 4, wherein the converter further comprises a third transistor coupled to the first transistor as a current mirror and having a drain coupled to the first terminal of the wire.

6. The data driver of claim 5, wherein the precharge unit further comprises a fourth transistor coupled between a first power source and the drain of the second transistor, and wherein the output stage further comprises a fifth transistor coupled between the first power source and the second terminal of the wire.

7. The data driver of claim 1, wherein the precharge voltage is predetermined and is independent of the data currents.

8. The data driver of claim 1, wherein the converter comprises a first transistor having a drain coupled to a first terminal of the wire and a source coupled to a first power source for supplying a first voltage, wherein the output stage comprises a second transistor having a drain coupled to a second terminal of the wire and a source coupled to a second power source for supplying a second voltage, and wherein the precharge unit outputs a third voltage between the second voltage and the first voltage as the precharge voltage.

9. The data driver of claim 8, wherein the third voltage is a mean voltage of the first voltage and the second voltage.

10. The data driver of claim 8, wherein the precharge unit comprises a first resistor and a second resistor coupled in series between the first power source and the second power source, wherein a first point where the first resistor and the second resistor meet is coupled to the first terminal of the wire.

11. The data driver of claim 10, wherein a resistance magnitude of the first resistor is equal to a resistance magnitude of the second resistor.

12. The data driver of claim 10, wherein the converter further comprises a third transistor coupled to the first transistor as a current mirror and having a drain to which the respective one of the data currents flows, wherein the precharge unit further comprises a first switch coupled between a gate of the third transistor and a gate of the first transistor, a second switch coupled between the second terminal of the wire and a drain of the second transistor, and a third switch coupled between the first terminal of the wire and the first point, and wherein the third switch is turned on and the first and second switches are turned off so that the precharge voltage is applied to the wire, and the third switch is turned off and the first and second switches are turned on so that the respective one of the data currents is transmitted to the output stage.

13. The data driver of claim 1, wherein the precharge unit determines a voltage corresponding to a respective one of the data signals to be the precharge voltage.

14. The data driver of claim 13, wherein the precharge unit comprises a voltage converter for generating the precharge voltage from at least one data bit among a plurality of data bits of the respective one of the data signals.

15. The data driver of claim 14, wherein the voltage converter comprises a plurality of resistors coupled in series between a first power source for supplying a first voltage and a second power source for supplying a second voltage, and wherein the voltage converter selects a selected point for outputting the precharge voltage from among a first point where the first power source and one of the plurality of resistors meet, a second point where the second power source and another one of the plurality of resistors meet, and a plurality of third points adjacent to where two of the plurality of resistors meet.

16. The data driver of claim 14, wherein the at least one data bit comprises a most significant bit of the respective one of the data signals.

17. The data driver of claim 14, wherein the converter comprises a first transistor for receiving the data current; and a second transistor coupled to the first transistor as a current mirror and having a drain coupled to a first terminal of the wire, wherein the output stage comprises a third transistor having a drain coupled to a second terminal of the wire.

18. The data driver of claim 17, wherein the precharge unit further comprises a first switch coupled between an output terminal of the voltage converter and the first terminal of the wire; and a second switch coupled between the second terminal of the wire and the drain of the third transistor, wherein the first switch is turned on and the second switch is turned off so that the precharge voltage is applied to the wire, and the first switch is turned off and the second switch is turned on so that the respective one of the data currents of the converter is transmitted to the output stage.

19. The data driver of claim 1, further comprising:

a latch for sequentially sampling and holding the plurality of data signals; and a multiplexing processor for multiplexing the plurality of data signals provided from the latch and sequentially transmitting the plurality of data signals to the converter, wherein the converter sequentially converts the plurality of data signals to the plurality of data currents, and sequentially transmits the plurality of data currents to the output stage, and wherein the output stage sequentially samples the plurality of data currents, and transmits the plurality of data currents to the plurality of data lines.

20. The data driver of claim 19, wherein the plurality of data signals comprises a plurality of first data signals representing a first color, a plurality of second data signals representing a second color, and a plurality of third data signals representing a third color, and wherein the converter comprises a first converter for converting the first data signals, a second converter for converting the second data signals, and a third converter for converting the third data signals.

21. The data driver of claim 19, wherein the plurality of data lines are divided into a plurality of groups, and the converter comprises a plurality of converters corresponding to the plurality of groups.

22. The data driver of claim 1, wherein the light emitting display uses an organic light emitting cell as a light emitting element.

23. A light emitting display comprising:

a display area including a plurality of data lines, a plurality of first scan lines, a plurality of second scan lines, and a plurality of pixel areas, the first and second scan lines extending perpendicular to the data lines, each of the pixel areas being defined by the data lines and a respective one of the first scan lines and having at least one light emitting element;

a scan driver for selectively transmitting a plurality of select signals to the plurality of first scan lines and selectively transmitting a plurality of emission control signals to the plurality of second scan lines; and a data driver including a converter for sequentially receiving a plurality of data signals and for sequentially converting the plurality of data signals to a plurality of data currents, and an output stage for sequentially receiving the data currents from the converter and for transmitting the data currents to the plurality of the plurality of data lines, wherein a precharge voltage is applied to a wire coupled between the converter and the output stage before a respective one of the data currents is transmitted from the converter to the output stage.

24. The light emitting display of claim 23, wherein the converter comprises a first transistor coupled to a first terminal of the wire and outputting a current corresponding to the respective one of the data currents, wherein the output stage comprises a second transistor coupled to a second terminal of the wire and for receiving a current flowing to the first transistor, wherein the data driver further comprises a precharge unit including a third transistor and a fourth transistor coupled in series, and wherein the precharge unit transmits the current corresponding to the respective one of the data currents to the third transistor, and the precharge voltage is a voltage at a first point where the third transistor and the fourth transistor meet.

25. The light emitting display of claim 24, wherein the converter further comprises a fifth transistor coupled to the second and third transistors as a current mirror and for transmitting the data current.

26. The light emitting display of claim 24, wherein the precharge unit further comprises a unit gain amplifier coupled between the first point and the first terminal of the wire, and for applying the voltage at the first point to the wire.

27. The light emitting display of claim 23, wherein the precharge voltage is determined by the respective one of the data currents.

28. The light emitting display of claim 23, wherein the precharge voltage is a voltage between a first voltage supplied from a first power source of the converter and a second voltage supplied from a second power source of the output stage.

29. The light emitting display of claim 28, wherein the converter comprises a first transistor coupled between a first terminal of the wire and the first power source and for outputting a current corresponding to the respective one of the data currents, wherein the output stage comprises a second transistor coupled between a second terminal of the wire and the second power source and for receiving a current flowing to the first transistor, wherein the data driver further comprises a precharge unit coupled between the first power source and the second power source and including a first resistor and a second resistor coupled in series, and a first point where the first resistor and the second resistor meet is coupled to the first terminal of the wire, and wherein the precharge voltage is a voltage at the first point.

30. The light emitting display of claim 29, wherein a resistance magnitude of the first resistor is equal to a resistance magnitude of the second transistor.

31. The light emitting display of claim 29, wherein the converter further comprises a third transistor coupled to the first transistor as a current mirror and for transmitting the respective one of the data currents.

32. The light emitting display of claim 23, wherein the precharge voltage is a voltage corresponding to at least one data bit of a respective one of the data signals.

33. The light emitting display of claim 32, wherein the converter comprises a first transistor coupled to a first terminal of the wire and for outputting a current corresponding to the data current, wherein the output stage comprises a second transistor coupled to a second terminal of the wire and for receiving a current flowing to the first transistor, wherein the data driver further comprises a precharge unit having a plurality of resistors coupled in series between a first power source and a second power source, and wherein the precharge voltage divides a voltage of the first power source and a voltage of the second power source according to the at least one data bit of the respective one of the data signals, and the divided voltage is the precharge voltage.

34. The light emitting display of claim 33, wherein the converter further comprises a third transistor coupled to the first transistor as a current mirror and for transmitting the respective one of the data currents.

35. The light emitting display of claim 23, wherein the light emitting element is an organic light emitting diode.

* * * * *

UNITED STATES PATENT AND TRADEMARK OFFICE

CERTIFICATE OF CORRECTION

PATENT NO. : 7,239,567 B2
APPLICATION NO. : 11/228755
DATED : July 3, 2007
INVENTOR(S) : Oh-Kyong Kwon It is certified that error appears in the above-identified patent and that said Letters Patent is hereby corrected as shown below:

On the Title Page

(54) Title — Delete "THERE OF", Insert --THEREOF--

In the Drawings

FIG. 3, Sheet 3 of 11 — Delete Drawing Sheet 3 and substitute therefore the Drawing Sheet, consisting of Fig. 3, as shown on the attached page

In the Claims

Column 17, line 6, Claim 23 — Delete "the plurality of the plurality of", Insert --the plurality of--

Signed and Sealed this

Fourteenth Day of October, 2008

JON W. DUDAS
*Director of the United States Patent and Trademark Office*

UNITED STATES PATENT AND TRADEMARK OFFICE

CERTIFICATE OF CORRECTION

PATENT NO. : 7,239,567 B2 
APPLICATION NO. : 11/228755
DATED : July 3, 2007
INVENTOR(S) : Oh-Kyong Kwon It is certified that error appears in the above-identified patent and that said Letters Patent is hereby corrected as shown below:

On the Title Page

| | |
|---|---|
| (54) Title and Column 1, line 2 | Delete "THERE OF", Insert --THEREOF-- |

In the Drawings

| | |
|---|---|
| FIG. 3, Sheet 3 of 11 | Delete Drawing Sheet 3 and substitute therefore the Drawing Sheet, consisting of Fig. 3, as shown on the attached page |

In the Claims

| | |
|---|---|
| Column 17, line 6, Claim 23 | Delete "the plurality of the plurality of", Insert --the plurality of-- |

This certificate supersedes the Certificate of Correction issued October 14, 2008.

Signed and Sealed this

Fourth Day of November, 2008

JON W. DUDAS
*Director of the United States Patent and Trademark Office*